US006756824B2

United States Patent
Roy et al.

(10) Patent No.: US 6,756,824 B2
(45) Date of Patent: Jun. 29, 2004

(54) SELF-BIASED DRIVER AMPLIFIERS FOR HIGH-SPEED SIGNALING INTERFACES

(75) Inventors: Aninda K. Roy, San Jose, CA (US); Samudyatha Suryanarayana, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/292,261

(22) Filed: Nov. 12, 2002

(65) Prior Publication Data

US 2004/0090249 A1 May 13, 2004

(51) Int. Cl.[7] .................................................. H03B 1/00
(52) U.S. Cl. ..................... 327/108; 327/112; 327/51; 327/379; 327/170
(58) Field of Search ..................... 327/170, 108, 327/109–112, 379, 389, 391, 427, 50–52, 58, 56, 62, 330, 384, 381, 380; 330/296; 326/22, 23, 26, 27, 82, 83

(56) References Cited

U.S. PATENT DOCUMENTS 6,046,624 A * 4/2000 Nam et al. ................... 327/530
6,509,763 B2 * 1/2003 Taguchi et al. ............... 327/58

* cited by examiner

Primary Examiner—Long Nguyen
(74) Attorney, Agent, or Firm—Blakely Sokoloff Taylor & Zafman, LLP

(57) ABSTRACT

Disclosed are novel methods and apparatus for efficiently providing self-biased driver amplifiers for high-speed signaling interfaces. In an embodiment of the present invention, a self-biased amplifier driver is disclosed. The driver includes a sensing circuit to sense a presence of noise in a power supply signal. The sensing circuit may include a current source to adjust an output signal of the sensing circuit in accordance with the power supply noise. The driver may further include: an amplifier coupled to the sensing circuit to amplify the sensing circuit output signal, a pre-driver to receive a data signal, and a driver coupled to the amplifier and the pre-driver to receive an amplifier output signal and a pre-driver output signal.

9 Claims, 3 Drawing Sheets

SELF-BIASED DRIVER AMPLIFIERS FOR HIGH-SPEED SIGNALING INTERFACES

FIELD OF INVENTION

The present invention generally relates to the field of electronics. More specifically, an embodiment of the present invention provides self-biased driver amplifiers for high-speed signaling interfaces.

BACKGROUND OF INVENTION

Chip-to-chip wireline communication consists of a chip sending and receiving data from another chip over wires incorporated on a board on which the communicating chips are placed. The sending chip drives the data onto the wire, otherwise known as a board trace, using a driver circuit. The receiving chip receives the data at the other end of the communication bus using a receiver circuit. In digital communication, the unit of data transferred maybe called a bit. In binary communication, where data is coded as a series of 1's and 0's, a 1 could be any voltage above a particular value, while a 0 could be any voltage below a certain value. The driving chip generally uses a driver amplifier to drive the board trace to the voltage level required to transmit the data. For example, in binary communication, the driver circuit charges the board trace to a high voltage to transit a 1 and to a low voltage to transmit a 0.

The performance of the signaling interface can be determined by the slew-rate and the voltage levels achieved by the driver amplifier. Slew-rate is the voltage rate of change as a function of time. Generally, a faster slew-rate and a higher voltage level result in a higher performance system, for example, by providing less jitter, more timing margin, and a faster data rate.

One determining factor in obtaining a fast slew-rate is the power supply of the driver. When the driver amplifier switches, the power supply collapses because of the inductance of the current path through the driver. Since the input of the driver amplifier is referenced to this power supply, a drop of the power supply reduces the gate-to-source voltage across the driver amplifier devices. The gate-to-source voltage determines the amount and rate of current the driver amplifier can source or sink to or from the board trace. Hence, a diminished overdrive voltage reduces the slew-rate of the voltage edge being transmitted into the board trace. Therefore, the drop of the power supply limits the performance of the driver amplifier.

SUMMARY OF INVENTION

The present invention includes novel methods and apparatus to efficiently provide self-biased driver amplifiers for high-speed signaling interfaces. In an embodiment of the present invention, a self-biased amplifier driver is disclosed. The driver includes a sensing circuit to sense a presence of noise in a power supply signal. The sensing circuit may include a current source to adjust an output signal of the sensing circuit in accordance with the power supply noise. The driver may further include: an amplifier coupled to the sensing circuit to amplify the sensing circuit output signal, a pre-driver to receive a data signal, and a driver coupled to the amplifier and the pre-driver to receive an amplifier output signal and a pre-driver output signal.

In another embodiment of the present invention, when the power supply noise is present the sensing circuit output signal may provide for a voltage change rate for a compensated signal that is faster than the voltage change rate for the data signal.

In a further embodiment of the present invention, a method of compensating for noise in a power supply signal is disclosed. The method includes: sensing noise in the power supply signal; determining whether the sensed noise meets a minimum threshold; if the noise meets the minimum threshold, generating a compensating signal; and generating a compensated data signal based on a received data signal and the compensating signal.

In yet a further embodiment of the present invention, the compensated data signal may have a relatively faster voltage change rate than the received data signal when the power supply noise is present.

BRIEF DESCRIPTION OF DRAWINGS

The present invention may be better understood and its numerous objects, features, and advantages made apparent to those skilled in the art by reference to the accompanying drawings in which.

The use of the same reference symbols in different drawings indicates similar or identical items.

DETAILED DESCRIPION

In the following description, numerous details are set forth. It will be apparent, however, to one skilled in the art that embodiments of the invention may be practiced without these specific details. In other instances, well-known structures, devices, and techniques have not been shown in detail, in order to avoid obscuring the understanding of the description. The description is thus to be regarded as illustrative instead of limiting.

Reference in the specification to "one embodiment" or "an embodiment" means that a particular feature, structure, or characteristic described in connection with the embodiment is included in at least an embodiment of the invention. The appearances of the phrase "in one embodiment" in various places in the specification are not necessarily all referring to the same embodiment.

Figure 1:
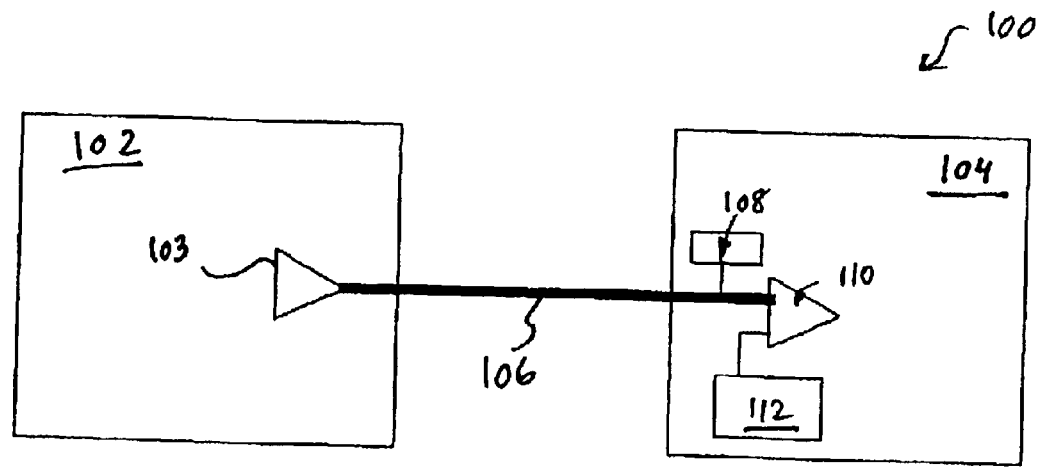
FIG. 1 illustrates an exemplary chip-to-chip communication system 100 in accordance with an embodiment of the present invention.

FIG. 1 illustrates an exemplary chip-to-chip communication system 100 in accordance with an embodiment of the present invention. The communication system 100 includes a driver chip 102 and a receiver chip 104. The driver chip includes a driver circuit 103. In an embodiment, the driver chip 102 and receiver chip 104 are connected together with a single signal trace 106 in a single-ended signaling scheme. As can be seen, the receiver chip 104 may include a termination circuit 108. In one embodiment, it is envisioned that the termination circuit 108 may match the termination at its input pin to that of the signal trace 106. Such an embodiment can ensure that there are no signal reflections to degrade signal transmissions on, for example, the signal trace 106. In an embodiment, each bit of data can be sent on the signal trace 106 by, for example, charging the signal trace 106 to a "high" voltage for a 1 and a "low" voltage for a 0.

A receiver circuit 110 may be utilized by the receiver chip 104 to capture the data received and compare the voltage associated with the received data at its input pin against an internally generated voltage reference signal. This voltage reference signal may be generated by a reference-voltage-generation circuit 112. In an embodiment, such as that illustrated in FIG. 1, both the receiver circuit 110 and the reference-voltage-generation circuit 112 may be implemented within the receiver chip 104.

Figure 2:
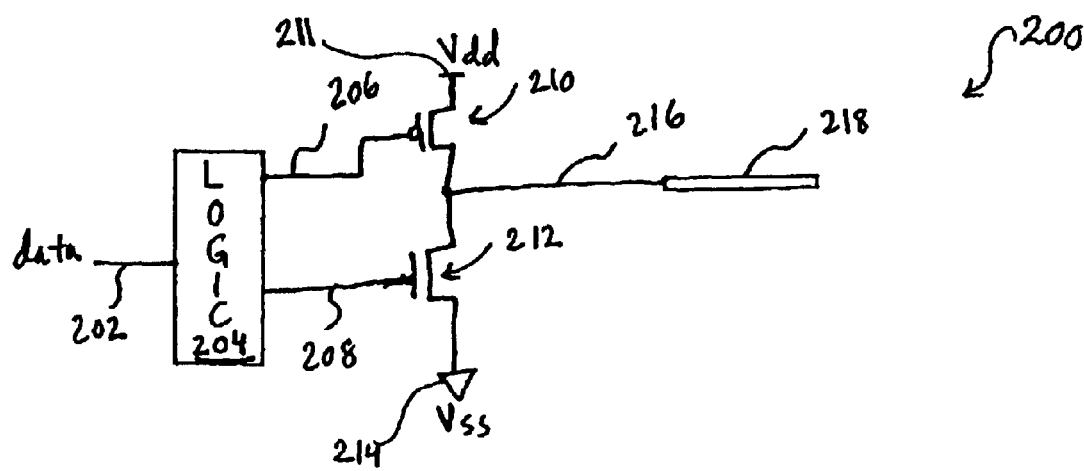
FIG. 2 illustrates an exemplary receiver 200 in accordance with an embodiment of the present invention.

FIG. 2 illustrates an exemplary driver 200 in accordance with an embodiment of the present invention. A driver circuit (such as 103 of FIG. 1) receives a data signal 202 at a logic 204 (as will be discussed further, for example, with reference to FIGS. 4 and 5), and provides an output 216 to a transmission line 218 (such as 106 of FIG. 1). Further, the logic 204 provides signals 206 and 208 to transistors 210 and 212, respectively. The transistors 210 and 212 are coupled between a Vdd voltage 211 and Vss voltage 214 and provide the output 216. In an embodiment, the receiver circuit 110 may be implemented as a source-synchronous device. Generally, a source-synchronous architecture (also known as clock forwarding) transmits a clock signal with the data from a driver circuit (such as 103 of FIG. 1). As a result, the clock and data arrive at the receiver at substantially the same time. In traditional synchronous clock distribution architecture, however, a common clock source supplies a clock to each recipient. The central clock source enables the data to be clocked in and out of the transceivers, for example. As a result, it is critical that all clocks arrive at each destination at precisely the same time. Minimizing clock skew is of particular importance when using a synchronous distribution scheme. Accordingly, utilizing a source-synchronous technique eliminates issues associated with the clock skew sensitivity of a synchronous design. Also, in an embodiment, the source-synchronous nature of the signaling interface ensures that there is a clock signal, which is complementary to the data with respect to its voltage level.

Figure 3:
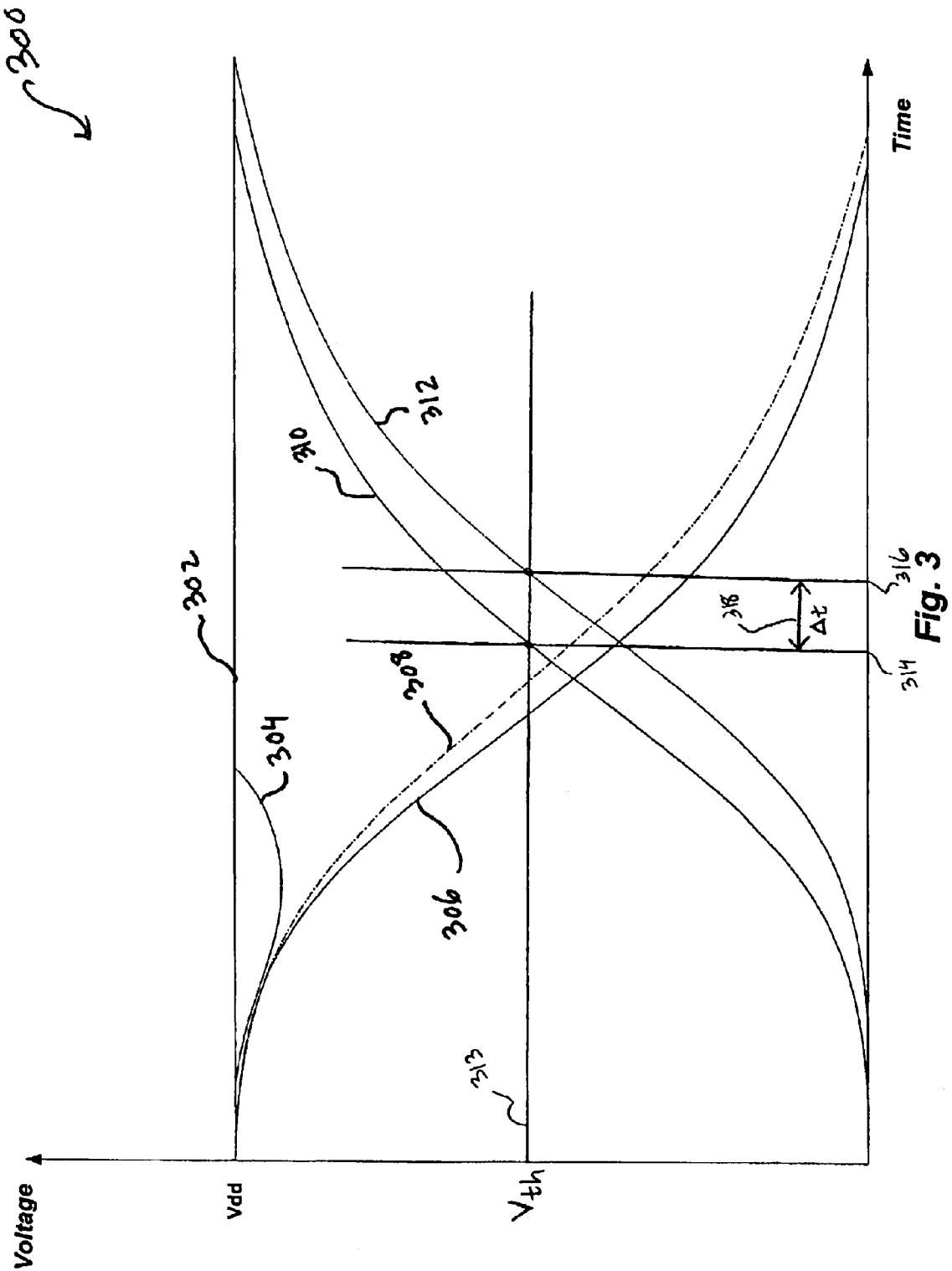
FIG. 3 illustrates an exemplary signal graph 300 of voltage versus noise of a receiver system (such as that of FIG. 2) in accordance with an embodiment of the present invention.

FIG. 3 illustrates an exemplary signal graph 300 of voltage versus noise of a receiver system (such as that of FIG. 2) in accordance with an embodiment of the present invention. A noiseless Vdd signal 302 is illustrated which may be associated with the signal 211 of FIG. 2, in an embodiment. A noisy Vdd signal 304 is illustrated having the spike 304. In a normal case (i.e., without any power supply noise), a signal 306 (which may be associated with the signal 206 of FIG. 2) is illustrated to transition from a high state to a low state over time. Due to the noisy signal 304, the signal 306 may shift in time (308). Under noiseless conditions, a signal 310 is illustrated which may be associated with the signal 216 of FIG. 2. But, as a result of the noisy signal 304, the output signal 310 may be shifted and become signal 112.

Accordingly, as a result of the noisy power supply signal 304 a threshold voltage point (313) may be shifted from a point in time (314) to a second point in time (316) resulting in a time delay of 318. In an embodiment, to compensate for the time delay 318 the noisy signal 304 may be sensed and the input signal 308 may be adjusted (e.g., by steeping) the signal 308 such that the noisy output 312 may be readjusted to a similar state as the normal noise less signal 310.

Generally, in implementations utilizing complementary metal oxide semiconductor (CMOS) technology, combining two signals to provide a single signal still provides a full swing output, whereas combining too many outputs may not provide a viable output signal. As such, in an embodiment, the combination of signals 330 and 334, 338 and 342, and 345 and 347 are envisioned to provide a full swing output signal.

Figure 4:
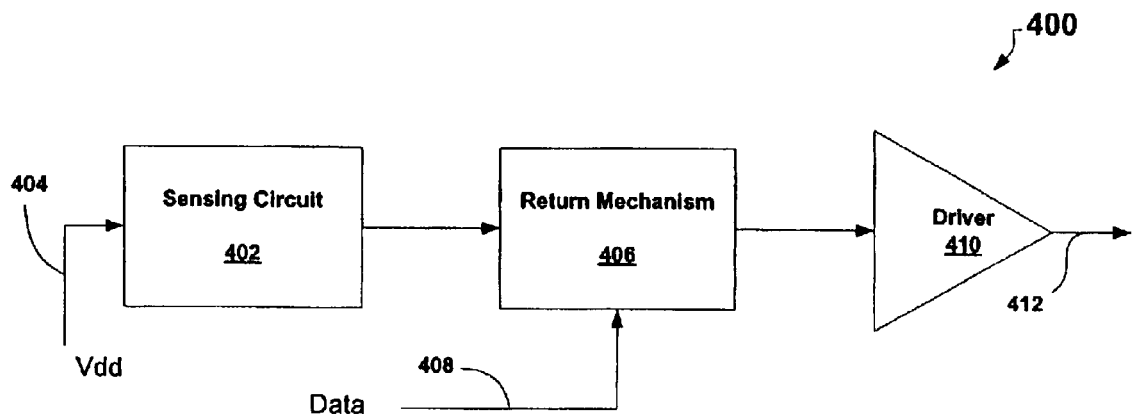
FIG. 4 illustrates an exemplary block diagram of a compensation device 400 in accordance with the embodiment of the present invention.

FIG. 4 illustrates an exemplary block diagram of a compensation device 400 in accordance with the embodiment of the present invention. The device 400 includes a sensing circuit 402, which receives a power supply signal 404 and provides its output to a return mechanism 406. The return mechanism 406 receives the data signal 408 and provides its output to a driver 410 that in turn provides the output 412 (which in an embodiment may be the same as the output 216 of FIG. 2). It is envisioned that the sensing circuit 402 may sense a change in the power supply signal 404 and provide a correction signal to the return mechanism 406 to compensate for any noise associated with the power supply signal 404.

The return mechanism 406 (e.g., by utilizing the sensing circuit correction signal) may adjust the data signal 408 before providing it to the driver circuit 410. Accordingly, the sensing circuit 402 may compensate for the time delay 318 of FIG. 3 by having the return mechanism 406 adjust the data signal 408 by, for example, steepening the descent rate of the signal 306 of FIG. 3 when a noise 304 is present. In embodiments with push-pull drivers such as that shown in respect to FIG. 2, it is envisioned that different sensing circuits may be utilized for positive-channel metal oxide semiconductor (PMOS) and negative-channel metal oxide semiconductor (NMOS) transistors.

Figure 5:
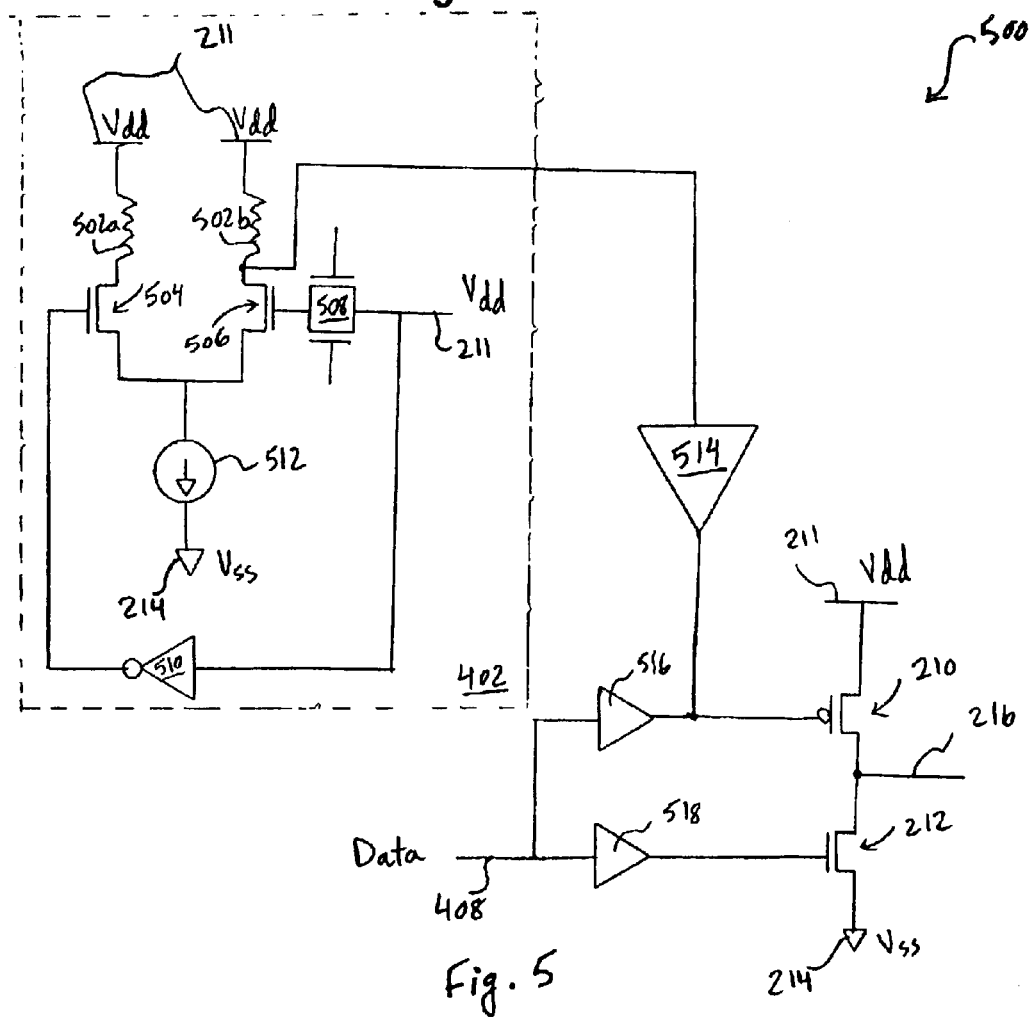
FIG. 5 illustrates exemplary circuit diagram of a compensation system 500 in accordance with an embodiment of the present invention.

FIG. 5 illustrates an exemplary circuit diagram of a compensation system 500 in accordance with an embodiment of the present invention. The system 500 includes a sensing circuit 402, which includes two optional resistors 502a and 502b connected to a power supply 211 and two NMOS transistors 504 and 506. The power supply signal 211 is feed to the gate of the transistor 506 through an optional pass gate 508 (which may be always on in one embodiment of the present invention) and to an inverter 510. In accordance with an embodiment of the present invention, the pass gate 508 may be present in a turned-on state to, for example, equalize the delay to the inputs of the transistors 504 and 506. The output of the inverter 510 is fed back to the gate of the transistor 504.

The sensing circuit 402 also includes a current source 512 which may be a customary current source such as a simple NMOS gate with a voltage bias input. The current source 512 receives its input from the source of the transistors 504 and 506 and provides output to the potent ional source 214. The output of the sensing circuit 402 is provided to an amplifier 514 which may be any type of customary amplifier such as a common source amplifier. The output of the amplifier 514 is provided to the gate of the transistor 210. The gate of the transistor 210 also receives a signal from a pre-driver 516, which may be a customary pre-driver in an embodiment. The output of the pre-driver 516 and the amplifier 514 may be combined to provide the input of the PMOS transistor 210. Similarly, the gate of the transistor 212 is coupled to a pre-driver 518 in an embodiment. The pre-driver 518 may be a customary pre-driver. It is envisioned that both the pre-drivers 516 and 518 may receive the data signal 408 as input. Alternatively, the transistors 210 and 212 may receive two different signals such as those discussed with respect to FIG. 2.

Accordingly, the edge rate associated with the power supply may be increased by applying the system 500. It is envisioned that in an embodiment the system 500 may also increase the swing associated with the power supply. In another embodiment, a simple voltage divider may be utilized to provide the sensing circuit 402. It is envisioned that one embodiment will provide a voltage divider utilizing a customary voltage divider utilizing resistors. The sensing circuit may be configured to detect a drop or change in the power system high voltage to certain accuracy. For example, when the power supply (Vdd) is at 1.5 volts, the threshold voltage may be configured to be detected at any voltage change of more than about 250 mV. In an embodiment, different sense circuits may be utilized for the PMOS transistor 210 and NMOS transistor 212. It is also envisioned that slightly different input signals for a driver may improve the driver characteristics. The threshold voltage may be adjusted in accordance with other drivers, which may be located near the driver of issue. In a further embodiment, any change in the voltage supply may be predicted a priori and the sensing circuit may be designed accordingly, so that it adjusts the swing and/or edge rate of the driver input signals sufficiently in advance of any noise.

The foregoing description has been directed to specific embodiments. It will be apparent to those with ordinary skill in the art that modifications may be made to the described embodiments, with the attainment of all or some of the advantages. For example, the techniques of the present invention may be applied to compensate for noise in any signal including ground signal noise. Therefore, it is the object of the appended claims to cover all such variations and modifications as come within the spirit and scope of the invention.

What is claimed is:

1. A self-biased amplifier driver comprising:
a sensing circuit to sense a presence of noise in a power supply, the sensing circuit including a current source to adjust an output signal of the sensing circuit in accordance with the power supply noise;
an amplifier coupled to the sensing circuit to amplify the sensing circuit output signal;
a pre-driver to receive a data signal; and
a driver coupled to the amplifier and the pre-driver to receive an amplifier output signal and a pre-driver output signal,
wherein when the power supply noise is present an output of the driver has a faster voltage change rate than the voltage change rate of the data signal.

2. The self-biased amplifier driver of claim 1 wherein the current source is coupled between a pair of NMOS transistors and ground in the sensing circuit.

3. The self-biased amplifier driver of claim 2 wherein the gate and the drain of each of the pair of NMOS transistors are coupled to the power supply.

4. The self-biased amplifier driver of claim 3
wherein the sensing circuit further comprises an inverter coupled between a gate of a first NMOS transistor of the pair of NMOS transistors and the power supply.

5. The self-biased amplifier driver of claim 4
wherein the sensing circuit further comprises a pass gate coupled between a gate of a second NMOS transistor of the pair of NMOS transistors and the power supply to compensate for signal delays associated with the inverter.

6. A method of compensating for noise in a power supply, the method comprising:
sensing a presence of noise in the power supply to generate a sensing signal;
amplifying the sensing signal to generate a compensating signal; and
generating a compensated data signal based on a received data signal and the compensating signal,
wherein when the power supply noise is present the compensated data signal has a faster voltage change rate than the voltage change rate of the received data signal.

7. The method of claim 6 further including providing the compensated data signal to a receiver.

8. An apparatus for compensation of noise in a power supply, the apparatus comprising:
means for sensing a presence of noise in the power supply to generate a sensing signal;
means for amplifying the sensing signal to generate a compensating signal; and
means for generating a compensated data signal based on a received data signal and the compensating signal, wherein when power supply noise is present the compensated data signal has a faster voltage change rate than the voltage change rate of the received data signal.

9. The apparatus of claim 8 further including means for providing the compensated data signal to a receiver.

* * * * *